United States Patent
Pascucci

[11] Patent Number: 5,838,623
[45] Date of Patent: Nov. 17, 1998

[54] METHOD FOR DETECTING REDUNDED DEFECTIVE ADDRESSES IN A MEMORY DEVICE WITH REDUNDANCY

[75] Inventor: Luigi Pascucci, Sesto san Giovanni, Italy

[73] Assignee: SGS-Thomson Microelectronics S.r.l., Agrate Brianza, Italy

[21] Appl. No.: 841,904

[22] Filed: Apr. 17, 1997

[30] Foreign Application Priority Data

Apr. 18, 1996 [EP] European Pat. Off. .............. 96830216

[51] Int. Cl.$^6$ ................................................. G11C 13/00
[52] U.S. Cl. ........................... 365/222; 365/210; 365/200
[58] Field of Search .............................. 365/189.01, 210, 365/222, 200

[56] References Cited

U.S. PATENT DOCUMENTS

| | | | |
|---|---|---|---|
| 5,381,370 | 1/1995 | Lacey et al. ............................. | 365/200 |
| 5,579,265 | 11/1996 | Devin ..................................... | 365/200 |

FOREIGN PATENT DOCUMENTS 0 242 854  10/1987  European Pat. Off. ........ G06F 11/20

OTHER PUBLICATIONS

European Search Report from European Patent Application 96830216.6, filed Apr. 18, 1996.

Primary Examiner—Terrell W. Fears
Attorney, Agent, or Firm—Wolf, Greenfield & Sacks, P.C.

[57] ABSTRACT

A method for detecting redunded defective addresses in a memory device with redundancy including at least one memory register for storing at least one defective address. The memory register includes a plurality of memory units each one storing a defective address bit and comparing the defective address bit with a respective current address bit supplied to the memory device; the memory register activates a respective redundancy selection signal when the current address coincides with the defective address stored therein. The method provides for: activating a forcing signal for forcing the activation of the redundancy selection signal to be independent of the coincindence of a first group of current address bits, associated to a respective first group of the memory units, with the defective address bits stored in the respective first group of memory units; scanning all the possible configurations of a second group of current address bits associated with a second group of the memory units and sequentially supplying the memory device with all the configurations; detecting a configuration of the second group of current address bits for which the redundancy selection signal is activated; while supplying the memory device with the configuration of the second group of current address bits, deactivating the forcing signal and sequentially supplying the memory device with a scanning of all the possible configurations of the first group of address bits; detecting a configuration of the first group of current address bits for which the redundancy selection signal is activated.

14 Claims, 4 Drawing Sheets

METHOD FOR DETECTING REDUNDED DEFECTIVE ADDRESSES IN A MEMORY DEVICE WITH REDUNDANCY

BACKGROUND OF THE INVENTION

1. Field of the Invention

The present invention relates to a method for detecting redunded defective addresses in a memory device with redundancy.

2. Discussion of the Related Art

In the field of semiconductor memories, it is a common technique to provide redundancy memory elements, such as redundancy word lines and/or bit lines, useful for functionally replacing defective word lines or bit lines. To this purpose, non-volatile memory registers (redundancy registers) must be provided in the memory device for storing the addresses of the defective memory elements (defective addresses), and for comparing a current address supplied to the memory device with the defective addresses stored therein: when the current address coincides with a defective address, the defective memory element is not selected, and a redundancy memory element is instead selected; if this occurs, it is said that the defective memory element has been redunded.

The functional substitution of a redundancy memory element for a defective memory element is completely transparent to the end user, but the memory device manufacturer could be interested in knowing which of the memory elements are defective, i.e. which are the defective addresses.

Conventionally, for implementing this particular test mode, output signals of the redundancy registers (i.e. the signals representative of the condition of coincidence between the current address supplied to the memory device and one of the defective addresses stored therein) are logically OR-ed together and the resulting signal is directly supplied to an output terminal of the memory device; the memory device is sequentially supplied with all the possible address configurations: when the current address configuration coincides with a defective address, a transition is detected at the output terminal, indicating that the current address is a defective address.

This methodology is time consuming, expecially for memories of large size: for example, in a byte-wide 16 Mbit device $2^{21}$ different address configurations must be sequentially scanned.

In view of the state of art described, it is an object of the present invention to provide an improved method for detecting redunded defective addresses in a memory device with redundancy which is faster than the conventional method.

SUMMARY OF THE INVENTION

According to the present invention, this and other objects are achieved by a method for detecting redunded defective addresses in a memory device with redundancy comprising at least one memory register for storing at least one defective address, said memory register comprising a plurality of memory units each one storing a defective address bit and comparing said defective address bit with a respective current address bit of a current address supplied to the memory device, the memory register activating a respective redundancy selection signal when the current address coincides with the at least one defective address stored therein, comprising the steps of:

activating a forcing signal for forcing the activation of said redundancy selection signal to be independent of the coincindence of a first group of current address bits, associated with a respective first group of said memory units, with the defective address bits stored in said respective first group of memory units;

scanning all the possible configurations of a second group of current address bits associated with a second group of said memory units and sequentially supplying the memory device with all said configurations;

detecting a configuration of said second group of current address bits for which said redundancy selection signal is activated;

while supplying the memory device with said configuration of the second group of current address bits, deactivating said forcing signal and sequentially supplying the memory device with a scanning of all the possible configurations of said first group of address bits;

detecting a configuration of said first group of current address bits for which said redundancy selection signal is activated.

The present invention provides a faster method to detect redunded defective addresses, because instead of scanning all the possible address configurations it provides for scanning a first subset of address bits, detecting which configurations of the subset of address bits are defective and, only for those configurations, scanning the remaining subset of address bits. The number of configurations to be scanned is thus substantially smaller than the overall number of address configurations of the memory device, thus allowing a significant time saving.

BRIEF DESCRIPTION OF THE DRAWINGS

These and other features and advantages of the present invention will be made more evident by he following detailed description of two particular embodiments, described as non-limiting examples in the annexed drawings, wherein.

DETAILED DESCRIPTION

Figure 1:
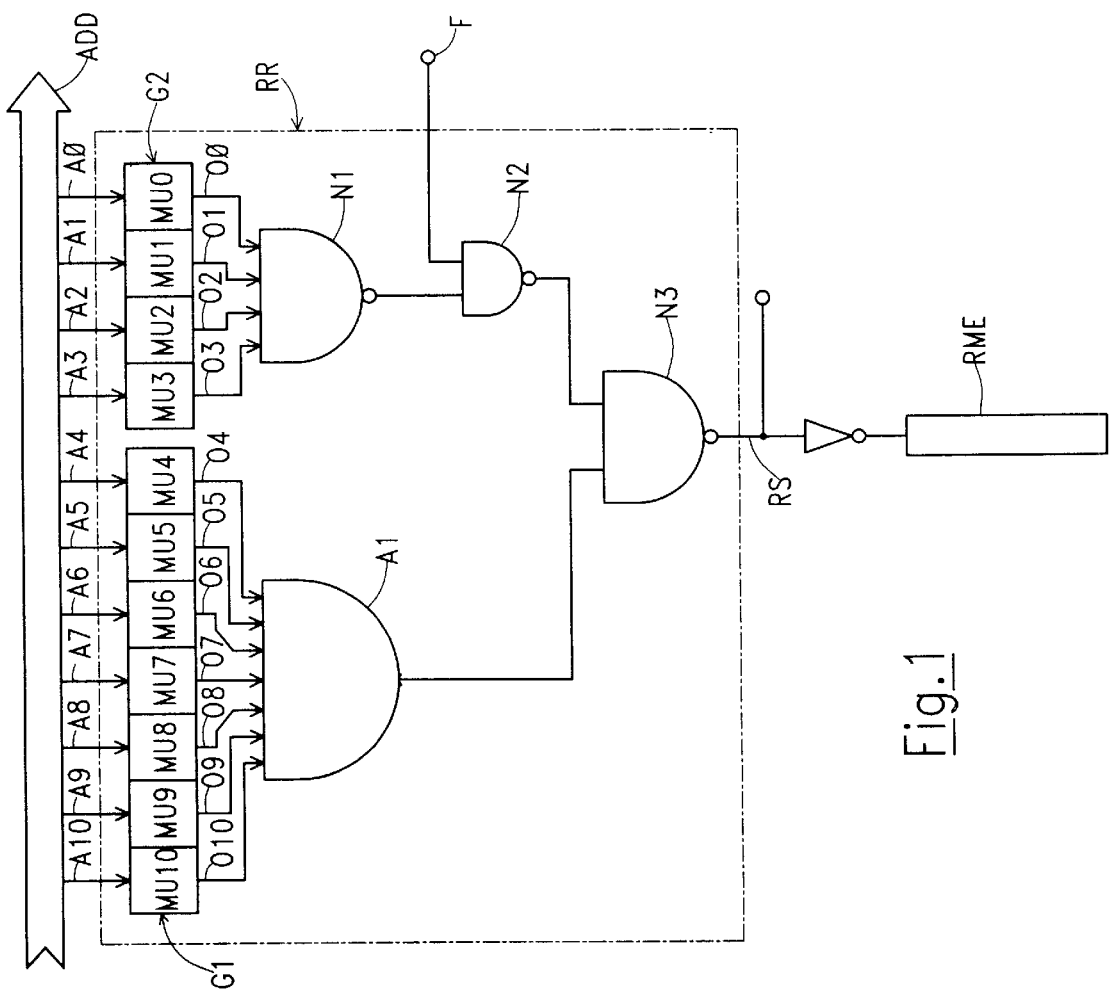
FIG. 1 schematically shows a first embodiment of a redundancy register suitable to implement the method of the present invention.

FIG. 1 schematically shows a programmable memory register (redundancy register) provided in a memory device to implement redundancy.

Figure 2:
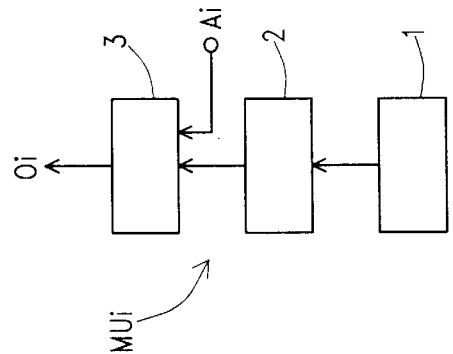
FIG. 2 schematically shows a programmable memory unit of the redundancy register.

The redundancy register RR comprises a plurality of programmable memory units MU0–MU10, each one capable of storing a binary information unit. Each one of the memory units MU0–MU10 is supplied by a respective address signal A0–A10 taken from an address signal bus ADD of the memory device. As known, memory devices comprise a matrix of memory cells arranged in row (word lines) and columns (bit lines); A0–A10 can be for example the row address signals which are decoded for selecting one of the word lines of the memory matrix; in an alternative, A0–A10 can be the column address signals which are decoded for selecting one of the bit lines of the memory matrix. As shown schematically in FIG. 2, each one of the memory units MU0–MU10 comprises in a per-se known way a programmable memory element 1, such as for example a fuse or a floating-gate MOS transistor, a sensing circuit 2 for reading the datum stored in the programmable memory element, and a digital comparator 3 for comparing the datum stored in the programmable memory element with the current address signal Ai (i=0 . . . 10). Each memory unit MUi generates a respective output signal Oi which is activated (at the high logic level) when the respective current address signal Ai coincides with the datum stored in the respective memory element.

The memory units MU0–MU10 are grouped in two groups: a first group G1 comprises for example the seven memory units MU4–MU10, associated with the seven most-significant address bits A4–A10; a second group G2 comprises the remaining four memory units MU0–MU3 associated with the four least-significant address bits A0–A3. Other divisions of the plurality of memory units MU0–MU10 among the two groups G1 and G2 are also possible.

The output signals O0–O3 of the second group G2 of memory units MU0–MU3 supply a first NAND gate N1; the output signals O4–O10 of the first group G1 of memory units MU4–MU10 supply an AND gate A1. An output signal of NAND gate N1 supplies a first input of a second NAND gate N2; a second input of NAND gate N2 is supplied by a forcing signal F, which is normally kept at the low logic level and is activated in a particular test mode, as will be explained in greater detail in the following.

An output signal of AND gate A1 and an output signal of NAND gate N2 supply a third NAND gate N3. An output signal RS of NAND gate N3 is activated (at the low logic level) only when the current address signals A0–A10 coincides with the address stored in the memory units MU0–MU10. Signal RS allows the selection of a respective redundancy memory element RME (for example a redundancy word line or a redundancy bit line). In practice, AND gate A1 and NAND gate N1 can be practically implemented by any combination of simpler logic gates suitable to optimize chip area and speed.

Figure 3:
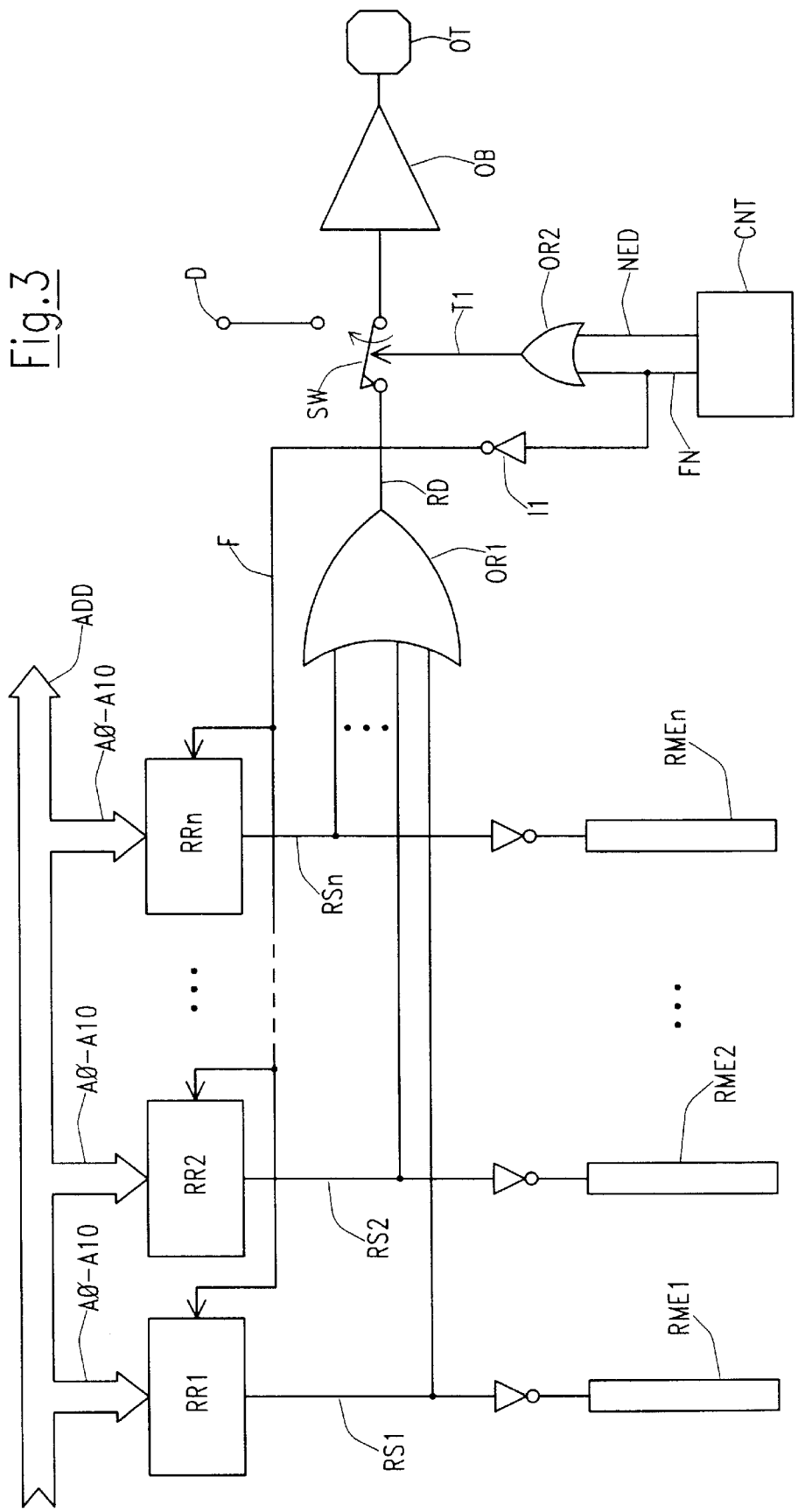
FIG. 3 schematically shows a circuit arrangement for actuating the method of the present invention.

As shown in FIG. 3, a plurality of redundancy memory elements RME1–RMEn is normally provided in a memory device (again, redundancy memory elements RME1–RMEn can be either redundancy word lines or redundancy bit lines). For each redundancy memory element, a respective redundancy register RR1–RRn having the structure shown in FIG. 1 must be provided; each one of the redundancy registers RR1–RRn generates a respective redundancy element selection signal RS1–RSn which is activated when the current address signals A0–A10 coincide with the address stored in the respective memory units MU0–MU10.

For testing purposes, the redundancy selection signals RS1–RSn are supplied to a first OR gate OR1. An output signal RD of OR gate OR1 is coupled to an output buffer OB through a switch SW controlled by a test signal T1. Switch SW switches the input of output buffer OB between signal RD and a data signal D carrying a datum obtained through the conventional read path of the memory device. Signal T1 is generated by a second OR gate OR2 which receives at its inputs two test signals NED and FN, generated by a control logic CNT which is normally provided in the memory device; signal FN is the logic complement of signal F, the latter being generated by an inverter I1. Output buffer OB drives an output terminal OT (output pad) of the memory device.

The circuit described above operates in the following way.

When the memory device is operated in the conventional read mode, the current address supplied to the memory device is compared, by the redundancy registers RR1–RRn, with the defective addresses stored therein.

If the current address is not a defective address (i.e., an address of a defective word line or bit line of the memory matrix) the signals RS1–RSn are not activated, and no redundancy memory element is selected. In normal read mode, test signals FN and NED are both deactivated, so that switch SW connects the input of output buffer OB to the data signal D, which carries the result of the sensing operation of an addressed memory cell of the memory matrix.

If the current address is a defective address, the redundancy register RR1–RRn wherein such defective address is stored activates the respective redundancy selection signal RS1–RSn (referring to FIG. 1, all the signals O0–O10 are activated). The activation of one redundancy selection signal RS1–RSn inhibits the selection of the defective word line or bit line, and enables the selection of the associated redundancy memory element RME1–RMEn. Also in this case, test signals FN and NED are deactivated, and switch SW connects the input of output buffer OB with the data signal D.

In a first test mode, control logic CNT activates signal NED: in this way, switch SW connectes the input of output buffer OB to the output RD of OR gate OR1. In this way, if the memory device is sequentially supplied with all the possible configurations of address signals A0–A10 (which in this example are $2^{11}$), each time the memory device is supplied with an address configuration corresponding to one of the defective addresses stored in the redundancy registers RR1–RRn, one of the redundancy selection signals RS1–RS2 will be activated, and the signal RD will also be activated. A logic-level transition will be detected at the output terminal OT of the memory device: it is thus possible to determine which address configurations correspond to defective addresses.

This is the conventional technique used in the prior art for detecting the defective addresses. It is easy to realize that such a technique requires a significant time to be completed, because the number of different address configurations is high: in the shown example, $2^{11}$ different address configurations must be scanned to detect the addresses of, for example, the defective word lines of the memory matrix; if, as usual, both redundancy word lines and redundancy bit lines are provided, a similar operation is to be performed for detecting the addresses of defective bit lines: this means that in the case of, for example, a byte-wide 16 Mbits memory, $2^{21}$ different address configurations must be scanned.

According to the present invention, a faster technique is made available in addition to the conventional one. This new test mode is activated by activating the signal FN which, as visible in FIG. 1, forces the output of NAND N2 to a logic "1" independently of the output of NAND N1, i.e., independently of the value of signals O0–O3. In this way, only the $2^7$ different configurations of the seven most significant address bits A4–A10 are initially scanned: when the current configuration of address signals A4–A10 coincides with the part of a defective address stored in the first group G1 of memory units MU4–MU10 of one of the redundancy registers RR1–RRn, the respective redundancy selection signal RS1–RSn is activated, signal RD is activated and a level transition can be detected at the output terminal OT of the memory device; when such a transition is detected, the current configuration of address signals A4–A10 is maintained, and the control logic deactivates signal FN and activates signal NED to enter the conventional test mode; address signals A0–A3 ($2^4$ different combinations) are then scanned to find the complete address signal configuration corresponding to a defective word line or bit line of the memory matrix.

It can be appreciated that by means of the new testing technique according to the present invention, a maximum of $2^7+n*2^4$ different address configurations have to be scanned to detect the defective addresses, where n is the number of redundancy memory elements RME1–RMEn. For example, if n=8, the number of different address configurations which must be scanned is 256, while with the conventional technique such number is $2^{11}=2048$. More generally, if m is the number of address bits, h is the number of address bits stored in the first group G1 of memory units, K is the number of address bits stored in the second group G2 of memory units, and n is the number of redundancy memory elements, the number of different address configurations to be scanned is $2^h+n*2^k$; for n small, this number is much less than $2^m$.

It should be understood that if both redundancy word lines and redundancy bit lines are provided in the memory device, the previously described procedure must be performed for both the row address signals and the column address signals.

Figure 4:
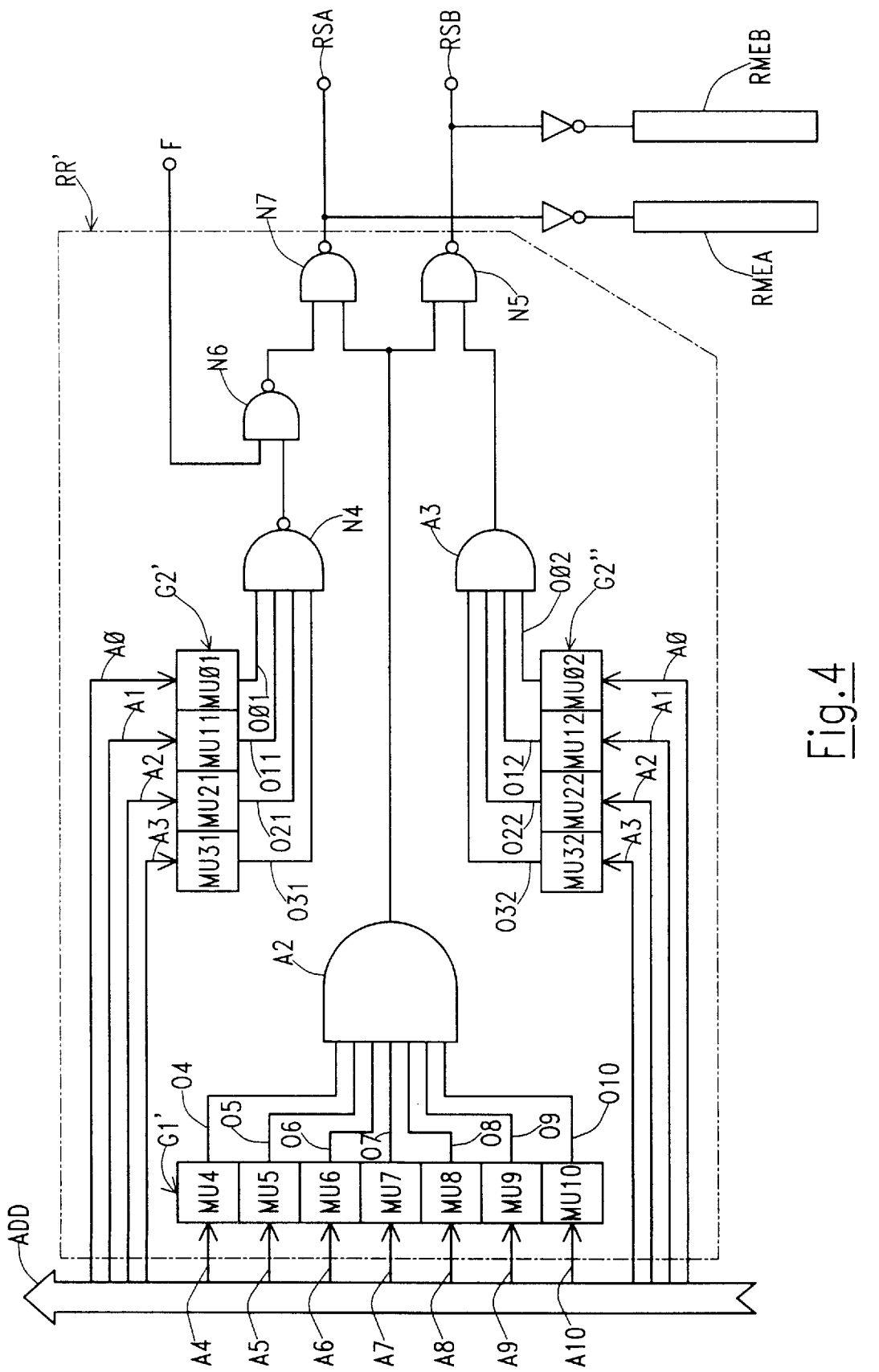
FIG. 4 schematically shows a second embodiment of a redundancy register suitable to implement the method of the present invention.

FIG. 4 schematically shows another embodiment of a redundancy register RR'. Differently from the embodiment of FIG. 1, which allows storing a single defective address, this second embodiment is capable of storing two defective addresses having at least a common part; for this reason the redundancy register RR' will be called "dual redundancy register". The redundancy register RR' comprises a first group G1' of programmable memory units MU4–MU10, associated to the address signals A4–A10, a second group G2' of programmable memory units MU01–MU31 associated to the address signals A0–A3, and a third group G2" of programmable memory units MU02–MU32 also associated to the address signals A0–A3. The first group G1' of memory units stores the common part of two defective addresses; the second group G2' of memory units MU01–MU31 stores the remaining part of one of the two defective addresses; the third group G2" of memory units MU02–MU32 stores the remaining part of the other of the two defective addresses. This structure of the redundancy register is particularly suitable in some kinds of memory devices, wherein there is a high probability that when a defective matrix word line or bit line exists, also the adjacent word line or bit line is defective: since adjacent word lines or bit lines generally have part of their addresses in common, it is advantageous to use a dual redundancy register instead of using two redundancy registers of the type shown in FIG. 1.

Output signals O4–O10 of the first group G1 of memory units supply a first AND gate A2. Output signals O01–O31 of the second group G2' of memory units supply a first NAND gate N4. Output signals O02–O32 of the third group G2" of memory units supply a second AND gate A3. An output signal of AND gate A2 and an output signal of AND gate A3 supply a second NAND gate N5. An output signal of NAND gate N4 supplies a first input of a third NAND gate N6 whose second input is supplied by the forcing signal F. An output signal of NAND gate N6 supplies a first input of a fourth NAND gate N7 whose second input is supplied by the output signal of AND gate A2. An output signal RSA of NAND gate N7 allows the selection of a first redundancy memory element RMEA associated to the redundancy register RR'; an output signal RSB of NAND gate N5 allows the selection of a second redundancy memory element RMEB associated to the redundancy register RR'.

Figure 5:
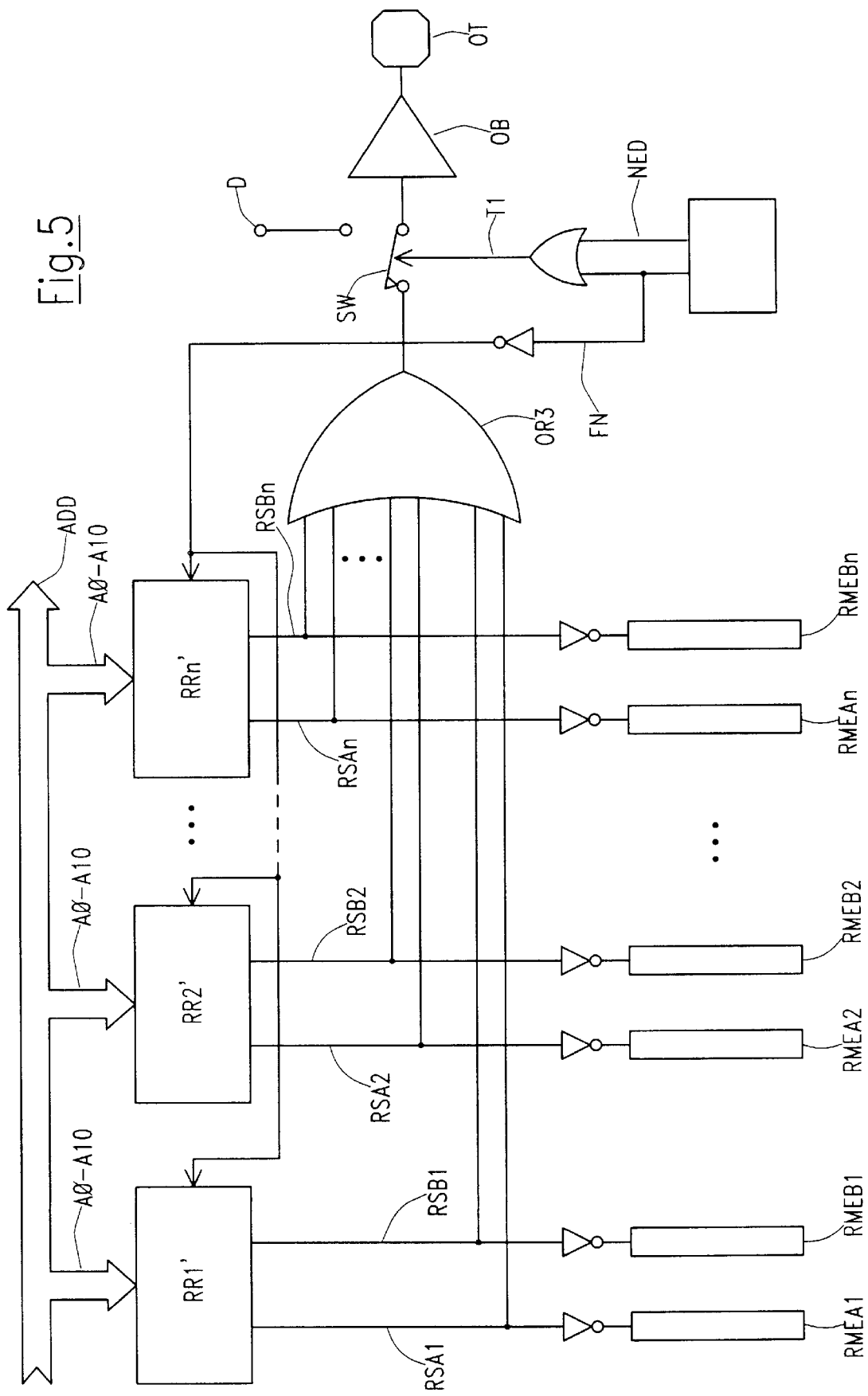
FIG. 5 shows a circuit arrangement similar to that FIG. 3, to be used with the redundancy registers according to the second embodiment.

FIG. 5 is similar to FIG. 3: a plurality of dual redundancy registers RR1'–RRn' is shown, each one associated to two respective redundancy memory elements RMEA1–RMEAn and RMEB1–RMEBn.

As in the case of FIG. 3, the redundancy selections signals RSA1–RSAn and RSB1–RSBn generated by the dual redundancy registers RR1'–RRn' supply an OR gate OR3; an output of OR gate OR3 can be selectively connected to an output buffer OB by means of a switch SW, controlled by a test signal T1; signal T1 is again the logic OR of signals FN and NED, generated by the control logic CNT.

As in the previous embodiment, two testing techniques are possible to detect the addresses corresponding to defective word lines or bit lines: a first technique is conventional and provides for sequentially scanning all the possible configurations of address signals A0–A10; this test mode is entered by activating the signal NED. A second technique is new and faster than the conventional one: it provides for forcing the output of NAND gate N6 in each dual redundancy register to a predetermined logic level equal to the logic level it would assume if the configuration of address signals A0–A3 were equal to the address configuration stored in the memory units MU01–MU31 of the second group G2'; then, only the address signals A4–A10 are scanned, so that when the configuration of signals A4–A10 coincides with the one stored in the first group G1' of memory units MU4–MU10 of one of the dual redundancy registers RR1'–RRn', the respective redundancy selection signal RSA1–RSAn is activated, and a logic level transition takes place at the output terminal OT: when such a transition is detected, the current configuration of address signals A4–A10 is maintained, the signal FN is deactivated and the signal NED is activated; then the remaining address signals A0–A3 are scanned: when the configuration of signals A0–A3 corresponds to the defective address part stored in the second group G2' or the third group G2" of memory units of the redundancy register, a transition will be detected at the output terminal OT of the memory device, indicating that the current address corresponds to a defective memory element (word line or bit line).

It should be observed that after having detected that the current configuration of address signals A4–A10 corresponds to the most significant part of a defective address, it is immediately possible to determine if the dual redundancy register RR1'–RRn' wherein said part of defective address is stored is completely utilized or if only one defective address is stored therein: to this purpose, and provided that it is assumed that defective addresses having A0= . . . =A3=1 are not redunded, it is sufficient to deactivate signal FN and activate signal NED, and to supply the memory device with a configuration of address signals A0–A3 corresponding to the unprogrammed (virgin) state of the memory units: if a level transition is detected at the output terminal OT, then it means that only one defective address is stored in the redundancy register, and there is the possibility to redund another defective address having a configuration of signals A4–A10 identical to that of the already stored defective address.

The present invention is not limited to the particular embodiments previously described; in particular, the number of memory units of the groups G1 and G2 or G1', G2' and G2" could be varied (obviously, the higher the number of memory units of group G1 or G1', the lower the number of memory units of group G2 or groups G2' and G2").

Having thus described at least one illustrative embodiment of the invention, various alterations, modifications, and improvements will readily occur to those skilled in the art. Such alterations, modifications, and improvements are

What is claimed is:

1. A method of detecting redunded defective addresses in a memory device with redundancy comprising at least one memory register for storing at least one defective address, said memory register comprising a plurality of memory units each one storing a defective address bit and comparing said defective address bit with a respective current address bit of a current address supplied to the memory device, the memory register activating a respective redundancy selection signal when the current address coincides with the at least one defective address stored therein, the method comprising the steps of:

a) activating a forcing signal for forcing the activation of said redundancy selection signal to be independent of the coincidence of a first group of current address bits, associated to a respective first group of said memory units, with the defective address bits stored in said respective first group of memory units;
   b) scanning all possible configurations of a second group of current address bits associated to a second group of said memory units and sequentially supplying the memory device with all said configurations;
   c) detecting a configuration of said second group of current address bits for which said redundancy selection signal is activated;
   d) while supplying the memory device with said configuration of the second group of current address bits, deactivating said forcing signal and sequentially supplying the memory device with a scanning of all possible configurations of said first group of address bits; and
   e) detecting a configuration of said first group of current address bits for which said redundancy selection signal is activated.

2. The method according to claim 1, the memory register being suitable to store two defective addresses with a common defective address part and comprising a second group of memory units for storing said common defective address part and two first groups of memory units each one storing a remaining part of a respective one of the two defective addresses, the memory register activating either a first or a second redundancy selection signal when the current address supplied to the memory device coincides with either one or the other of said two defective addresses, the method further comprising the steps of:

f) activating the forcing signal for forcing the activation of the first redundancy selection signal to be independent of the coincidence of the first group of current address bits, associated with said two first groups of memory units, with the defective address bits stored in one of said two first groups of memory units;
   g) scanning all the possible configurations of a second group of current address bits associated with the second group of memory units and sequentially supplying the memory device with all said configurations;
   h) detecting a configuration of said second group of current address bits for which said first redundancy selection signal is activated;
   i) while supplying the memory device with said configuration of the second group of current address bits, deactivating said forcing signal and sequentially supplying the memory device with a scanning of all the possible configurations of said first group of address bits; and
   j) detecting the two configurations of said first group of current address bits for which the first and the second redundancy selection signals are respectively activated.

3. The method according to claim 1, the memory device comprising a plurality of memory registers each one storing at least one defective address and activating a respective redundancy selection signal when the current address supplied to the memory device coincides with the at least one defective address stored therein, wherein steps d) and e) are repeated for all the configurations of said second group of current address bits for which during step c) the activation of one of the redundancy selection signals is detected.

4. The method according to claim 1, wherein said first group and second group of current address bits form a column address for selecting a column of memory cells of the memory device.

5. The method according claim 1, wherein said first group and second group of current address bits form a row address for selecting a row of memory cells of the memory device.

6. A redundancy circuit for a memory device, comprising at least one redundancy memory register for storing at least one defective address, said memory register comprising a plurality of memory units each one storing a defective address bit and comparing said defective address bit with a respective current address bit of a current address supplied to the memory device, the memory register activating a respective redundancy selection signal when the current address coincides with the at least one defective address stored therein, wherein the memory register comprises forcing means controlled by a forcing signal activated in a test condition for forcing the activation of the redundancy selection signal to be independent of the coincidence of a first group of current address bits, associated with a respective first group of said memory units, with the defective address bits stored in said respective first group of memory units, whereby detection of the defective address stored in the redundancy register is carried out by sequentially supplying the memory device with all possible configurations of a second group of current address bits associated with a second group of memory units to detect a configuration of said second group of current address bits for which the redundancy selection signal is activated, and while maintaining said configuration of the second group of current address bits, deactivating the forcing signal and scanning all the configurations of the first group of address bits.

7. The redundancy circuit according to claim 6, wherein each memory unit comprises a programmable memory element, a sensing circuit for reading a datum stored in the memory element and comparator means for comparing the datum stored in the memory element with the respective current address bit, said comparator means activating a comparison signal when the datum stored in the memory element coincides with the respective current address bit.

8. The redundancy circuit according to claim 7, wherein the redundancy register comprises a first logic gate for activating a first output signal when the comparison signals of said second group of memory units are all activated, said forcing means comprising a second logic gate for activating a second output signal when the comparison signals of said first group of memory units are all activated, a third logic gate supplied by said second output signal and said forcing signal for activating a third output signal when either the second logic signal is activated or the forcing signal is activated, and a fourth logic gate supplied by said first output signal and third output signal for activating said redundancy selection signal when both the first output signal and the third output signal are activated.

9. The redundancy circuit according to claim 6, the memory register being suitable to store two defective addresses with a common defective address part and comprising a second group of memory units for storing said common defective address part and two first groups of memory units each one storing a remaining part of a respective one of the two defective addresses, the memory register activating either a first or a second redundancy selection signal when the current address supplied to the memory device coincides with either one or the other of said two defective addresses, wherein said forcing means force the activation of the first redundancy selection signal to be independent of the coincidence of the first group of the current address bits, associated with said two first groups of memory units, with the defective address bits stored in one of said two first groups of memory units.

10. The redundancy circuit according to claim 6, further comprising a plurality of memory registers each one storing at least one defective address and activating a respective redundancy selection signal when the current address supplied to the memory device coincides with the at least one defective address stored therein.

11. The redundancy circuit according to claim 6, wherein said first group and second group of current address bits form a column address for selecting a column of memory cells of the memory device.

12. The redundancy circuit according to claim 6, wherein said first group and second group of current address bits form a row address for selecting a row of memory cells of the memory device.

13. The redundancy circuit according to claim 6, wherein said forcing signal is generated by a control logic circuit internal to the memory device.

14. The method according to claim 2, the memory device comprising a plurality of memory registers each one storing at least one defective address and activating a respective redundancy selection signal when the current address supplied to the memory device coincides with the at least one defective address stored therein, wherein steps i) and j) are repeated for all the configurations of said second group of current address bits for which during step h) the activation of one of the redundancy selection signals is detected.

* * * * *